United States Patent
Walker et al.

[11] Patent Number: 5,966,599
[45] Date of Patent: Oct. 12, 1999

[54] METHOD FOR FABRICATING A LOW TRIGGER VOLTAGE SILICON CONTROLLED RECTIFIER AND THICK FIELD DEVICE

[75] Inventors: John D. Walker, Colorado Springs; David W. Daniel, Divide, both of Colo.

[73] Assignee: LSI Logic Corporation, Milpitas, Calif.

[21] Appl. No.: 08/651,018

[22] Filed: May 21, 1996

[51] Int. Cl.[6] .............................................. H01L 21/8238
[52] U.S. Cl. .......................... 438/228; 438/202; 438/135; 438/217; 438/374
[58] Field of Search ...................................... 438/202, 207, 438/217, 228, 374, 426, 703, 135; 257/356

[56] References Cited

U.S. PATENT DOCUMENTS

| | | | |
|---|---|---|---|
| 4,762,802 | 8/1988 | Parrillo | 437/24 |
| 5,055,417 | 10/1991 | Akcasu | 438/135 |
| 5,072,273 | 12/1991 | Avery | 357/38 |
| 5,218,249 | 6/1993 | Jordan | 307/631 |
| 5,274,262 | 12/1993 | Avery | 257/362 |
| 5,292,671 | 3/1994 | Odanaka | 438/433 |
| 5,296,401 | 3/1994 | Mitsui et al. | 437/57 |
| 5,322,804 | 6/1994 | Beason | 437/29 |
| 5,436,176 | 7/1995 | Shimizu et al. | 437/27 |
| 5,455,436 | 10/1995 | Cheng | 257/356 |
| 5,465,189 | 11/1995 | Polgreen et al. | 361/58 |
| 5,478,759 | 12/1995 | Mametani et al. | 438/228 |
| 5,478,761 | 12/1995 | Komori et al. | 438/228 |
| 5,489,540 | 2/1996 | Liu et al. | 437/30 |
| 5,573,963 | 11/1996 | Sung | 438/217 |
| 5,693,505 | 12/1997 | Kobayashi | 438/228 |

*Primary Examiner*—Peter Toby Brown
*Assistant Examiner*—Khanh B. Duong
*Attorney, Agent, or Firm*—Wayne P. Bailey; Duke W. Yee

[57] ABSTRACT

A method for fabricating a semiconductor device in a substrate. Active regions are defined within the substrate using a thin oxide layer and a silicon nitride layer with portions of the silicon nitride layer being etched away to expose the thin oxide layer. Field oxide regions are formed over regions other than the defined active regions. These field oxide regions are located between the active regions. The remaining portions of the silicon nitride layer and the thin oxide layer are removed and a sacrificial oxide layer is then grown on the surfaces of the active regions. A first mask, a N-well mask, is formed for implanting N-type dopants. A buried layer implanted using P-type dopants with the first mask in place. Thereafter, the N-well regions are implanted. The first mask is removed and a second mask is formed to define regions for implanting P-well regions using P-type dopants. The P-well regions are implanted using P-type dopants.

28 Claims, 11 Drawing Sheets

METHOD FOR FABRICATING A LOW TRIGGER VOLTAGE SILICON CONTROLLED RECTIFIER AND THICK FIELD DEVICE

BACKGROUND OF THE INVENTION

1. Technical Field

The present invention relates generally to semiconductor devices and in particular to electrostatic discharge protection devices. Still more particularly, the present invention relates to a method for fabricating a low trigger voltage silicon controlled rectifier and thick field device for use in electrostatic discharge protection devices.

2. Description of the Related Art

Electrostatic discharge (ESD) phenomena commonly result from pulses of high voltage (typically, several kilovolts), moderate current (a few amperes) and short duration (on the order of 100 nanoseconds) generated by a variety of sources such as human bodies, electric fields generated by machinery, and the like.

ESD effects are a common problem in integrated circuit (IC) electronics and are particularly troublesome in complimentary metal oxide semiconductor (CMOS) devices which have particularly thin gate oxides and very short channel devices. Such structures typically can withstand only a few tens of volts. An ESD pulse conducted through a CMOS IC can induce oxide rupture and device or interconnect burnout. An ESD pulse can also induce a "latch-up" condition in thick field devices.

ESD problems can be abated somewhat by including appropriate anti-static protection on the circuit boards on which the ICs are installed; however, the ICs still are susceptible to ESD before and during the circuit board fabrication process. A general personnel awareness of ESD problems and counter measures such as electrically grounded bracelets and the like reduce risks in this phase of the IC life span; however, it is at best a partial solution. Therefore, it is desirable to include ESD protection circuitry within the IC itself.

In fabricating ESD protection circuitry, it is desirable to produce the structures for the circuitry using as few steps as possible. The reduction in the number of steps decreases the amount of time necessary to produce a semiconductor device. Furthermore, a savings in cost and materials may be gained by reducing steps required to produce a semiconductor device. Therefore, it would be an advantage to have an improved method for fabricating ESD protection circuitry within a semiconductor substrate.

SUMMARY OF THE INVENTION

The present invention provides a method for fabricating a semiconductor device in a substrate. Active regions are defined within the substrate using a thin oxide layer and a silicon nitride layer with portions of the silicon nitride layer being etched away to expose the thin oxide layer. Field oxide regions are formed over regions other than the defined active regions. These field oxide regions are located between the active regions. The remaining portions of the silicon nitride layer and the thin oxide layer are removed and a sacrificial oxide layer is then grown on the surfaces of the active regions. A first mask, a N-well mask, is formed for implanting N-type dopants. A buried layer is implanted using P-type dopants with the first mask in place. Thereafter, the N-well regions are implanted. The first mask is removed and a second mask is formed to define regions for implanting P-well regions using P-type dopants. The P-well regions are implanted using P-type dopants.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections and layouts of portions of an integrated circuit during fabrication are not drawn to scale, but instead are drawn so as to illustrate the important features of the invention.

The present invention will be described in reference to a CMOS process. However, those of ordinary skill in the art will appreciate that selecting differing dopant types and adjusting concentrations allows the invention to be applied to PMOS, NMOS and other processes that are susceptible to latch-up or damage caused by electrostatic discharge (ESD).

A typical CMOS device has wells of N-type and P-type dopant separated by field oxide. Within an N-well, P-type source and drain regions are formed. In neighboring P-wells, N-type source and drain regions are formed. Parasitic PNPN regions thus exist throughout the circuit. If an ESD pulse injects a voltage spike into the circuit, it can cause damage to the circuit.

In the present invention, an integrated circuit is protected against ESD pulses by a thick-field silicon controlled rectifier (SCR) connected to the input and output pads. The SCR contains an NMOS thick field device (TFD) as the SCR trigger. The term "thick field" here refers to a device in which a "thick" field oxide serves as an insulator. The thick-field oxide can span adjacent wells and is more than an order of magnitude thicker than the gate oxides used for devices formed within a single well.

Figure 1:
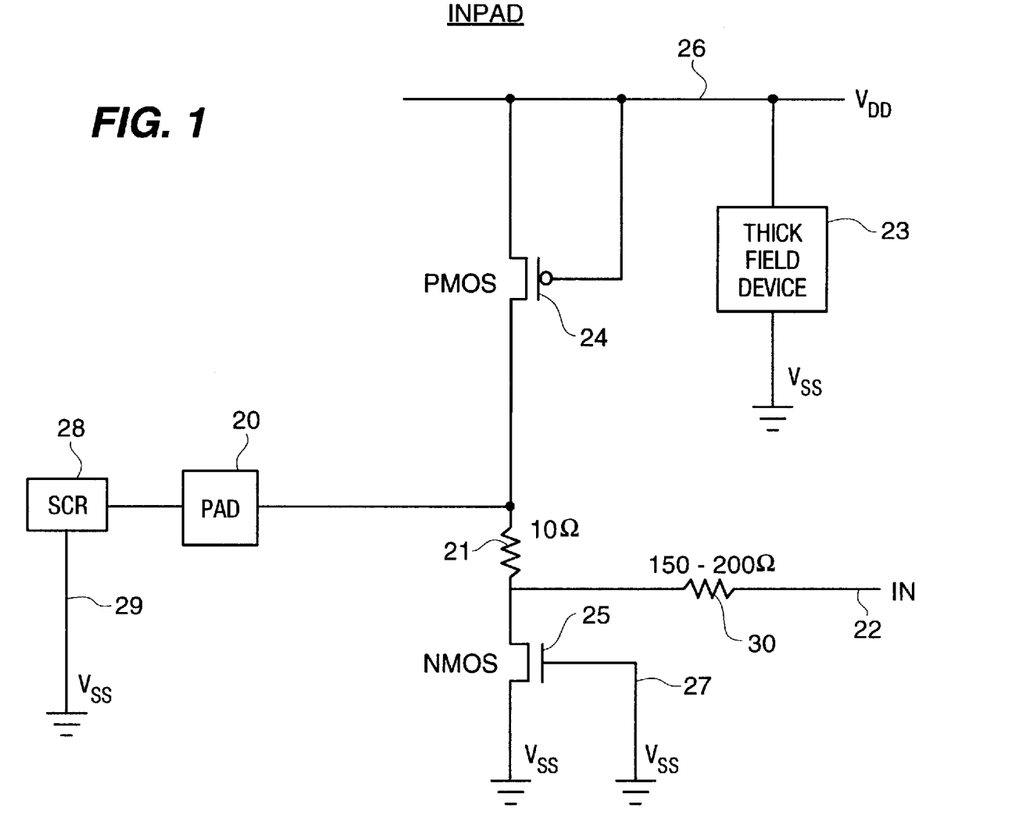
FIG. 1 illustrates a schematic diagram of an ESD protection circuit having an SCR fabricated according to the present invention.

FIG. 1 illustrates a schematic diagram of an ESD protection circuit having an SCR fabricated according to the present invention. An input pad 20 connects through resistors 21 and 30 to a IN signal line 22 which connects to other circuitry on the chip. A thick field device 23 connects Vdd 26 to Vss to act as a return path for any ESD pulse. This device switches before the ESD pulse can damage active circuits internal to the input protection device.

An SCR 28 provides an independent conduction path 29 from the input pad 20 to Vss. Resistors 21 and 30 limit current flow onto the IN line 22, which in turn provides time for the SCR 28 to turn on and shunt the ESD pulse. Resistor 21 may have a resistance of 10Ω while resistor 30 may have a resistance between 150Ω and 200Ω.

Figure 2:
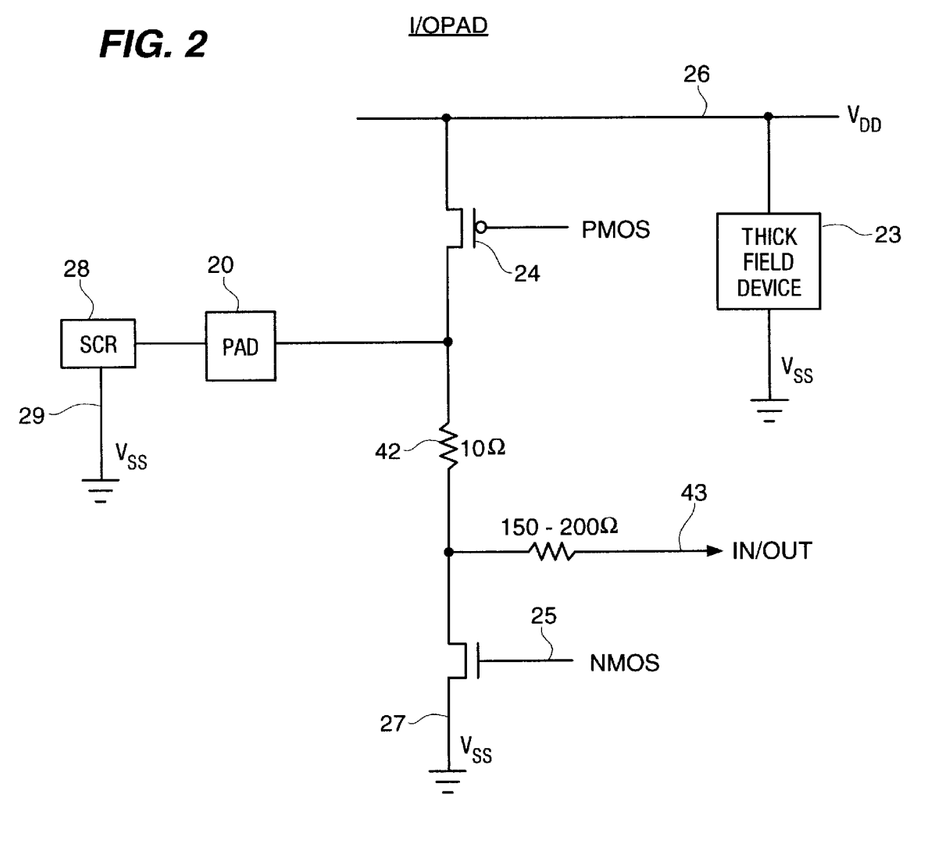
FIG. 2 illustrates a schematic diagram of another ESD protection circuit having an SCR fabricated according to the present invention.

FIG. 2 illustrates a schematic diagram of another ESD protection circuit having an SCR fabricated according to the present invention. Many of the circuit elements are identical to ones shown in FIG. 1, and elements that are the same in FIGS. 1 and 2 are designated with the same reference numerals.

An input/output pad 20 connects through a ten ohm polysilicon resistor 42 to an IN/OUT signal line 43 which connects to other circuitry on the chip. A thick field device 23 connects Vdd 26 to Vss. Two transistors, one a PMOS device 24 and the other an NMOS device 25 tie the IN/OUT signal line 43 to Vdd 26 and Vss 27 connections respectively. An SCR 28, when in its "ON" mode, provides an independent conduction path 29 from input pad 20 to Vss. Resistor 42 limits current flow onto IN line 43, which in turn provides time for SCR 28 to turn on and shunt the ESD pulse.

The implanted thick field device (TFD) is a component by itself and also is a subcomponent of an implanted silicon controlled rectifier. A TFD is formed by selectively implanting the base of the lateral NPN of the MOS thick field device with boron. The boron implant dose is adjusted to control the breakdown voltage of the N+ to P− junction, and thus the trigger voltage of the TFD and the SCR. The N+ to P− voltage is set to be greater than the maximum value of Vdd and approximately 80 percent of the gate breakdown voltage. Depending on Vdd and the gate breakdown voltage, the range of the breakdown voltage is between 7 volts and 10 volts. Because of the known relationship between the breakdown voltage and carrier concentration, this implies that the doping of the P− base of the lateral NPN TFD must be approximately $1e17/cm^2$. The SCR is formed by connecting the TFD with a vertical PNP device. The base and emitter of the NPN and PNP are common. The collector and base of the NPN and PNP are common and are connected by diffused regions. More information on SCRs and TFDs may be found in U.S. patent application Ser. No. 08/129,224, filed Sep. 29, 1993, entitled Field Implant for Silicon Controlled Rectifier, which is incorporated herein by reference.

Figure 3A:
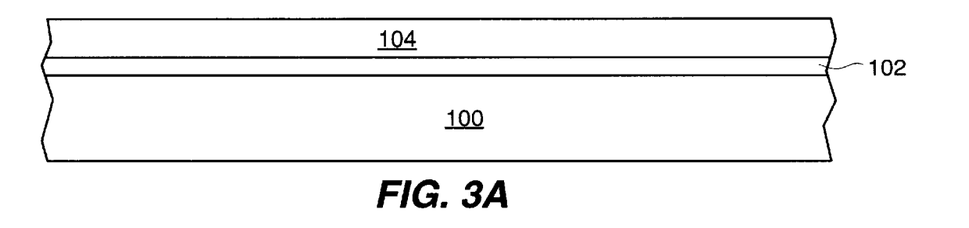
FIGS. 3A–3J depict cross sectional views illustrating various stag of fabrication of a SCR and TFD according to the present invention.
Figure 3B:
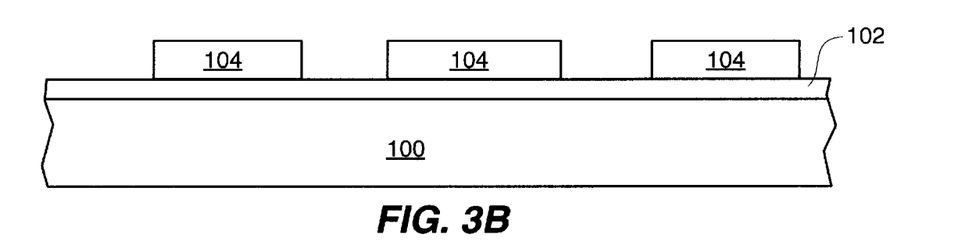
Figure 3C:
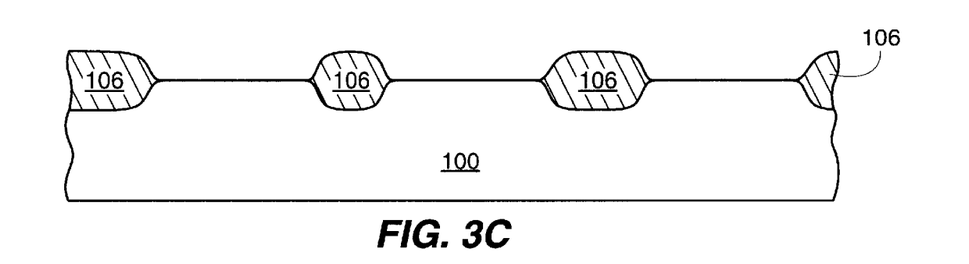

With reference now to FIGS. 3A–3J, cross sectional views illustrating various stages of fabrication of a SCR and TFD are depicted according to the present invention. As can be seen in FIG. 3A, the devices are formed in a P− substrate 100 according to the present invention. Of course, those of ordinary skill in the art will realize that the present invention may be applied to other types of substrates. A thin oxide layer 102 is formed over substrate 100. Thin oxide layer 102 has a thickness of 300 angstroms. This layer may have a thickness from a range of about 200 angstroms to about 800 angstroms. A thicker silicon nitride layer ($Si_3N_4$) 104 is formed over thin oxide layer 102. Silicon nitride layer 104 has a thickness of 1600 angstroms and may range from about 500 angstroms to about 2000 angstroms thick. In FIG. 3B, portions of silicon nitride layer 104 have been etched away to define active regions within substrate 100. The remaining portions of silicon nitride layer 104 overlie the active regions. In FIG. 3C, field oxide regions 106 are grown in the areas in which thin oxide layer 102 has been exposed with silicon nitride layer 104 and thin oxide layer 102 being stripped off after the formation of field oxide regions 106. Field oxide regions 106 may have a thickness from about 2000 angstroms to about 6000 angstroms.

Figure 3D:
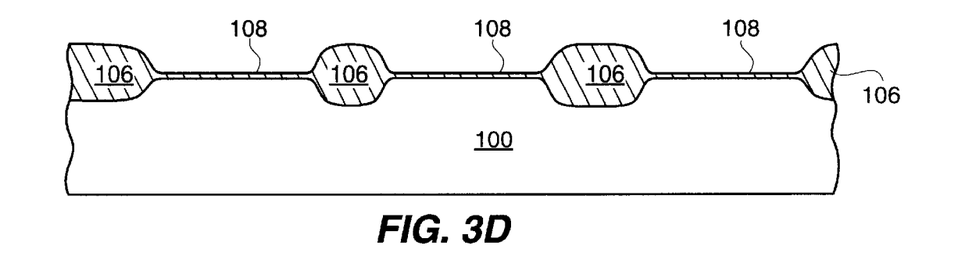
Figure 3E:
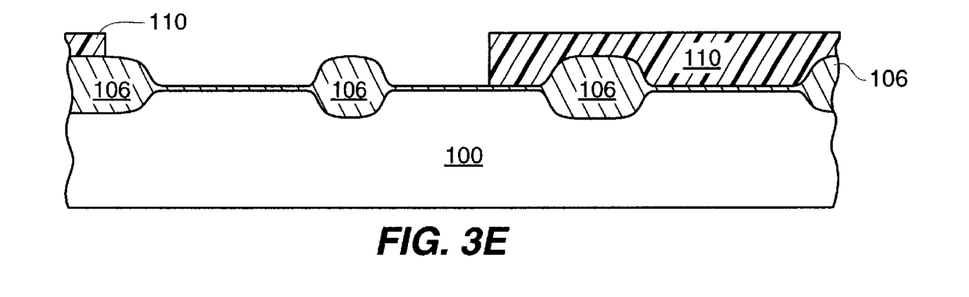
Figure 3F:
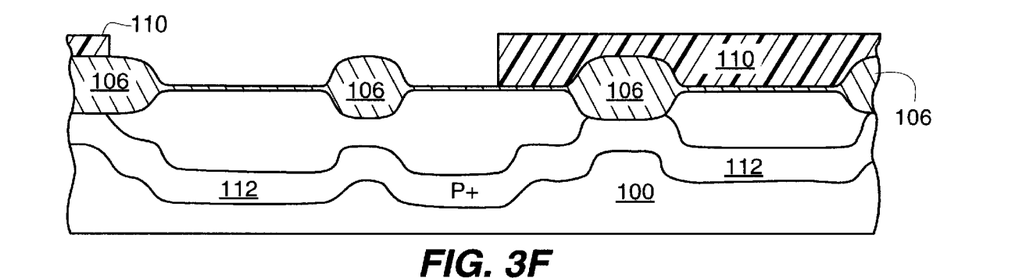

Thereafter, in FIG. 3D a sacrificial oxide layer 108 is formed over the semiconductor device. Sacrificial oxide layer 108 has a thickness of 200 angstroms in the depicted example. The thickness of sacrificial oxide layer 108 may range from about 50 angstroms to about 500 angstroms. In FIG. 3E, a N-well mask 110 is applied and patterned to define regions in which N-wells will be formed in semiconductor 100. The thickness of the N-well resist is between about 2 microns and about 2.5 microns. In FIG. 3F, a first type of dopant, a P-type dopant in the form of boron, is implanted to form P+ buried layer 112 in semiconductor 100. P+ buried layer 112 is implanted at an energy level between about 1.3 MeV and about 2.5 MeV and using doses of between about $1e13/cm^2$ and about $3e14/cm^2$ in accordance with a preferred embodiment of the present invention.

Figure 3G:
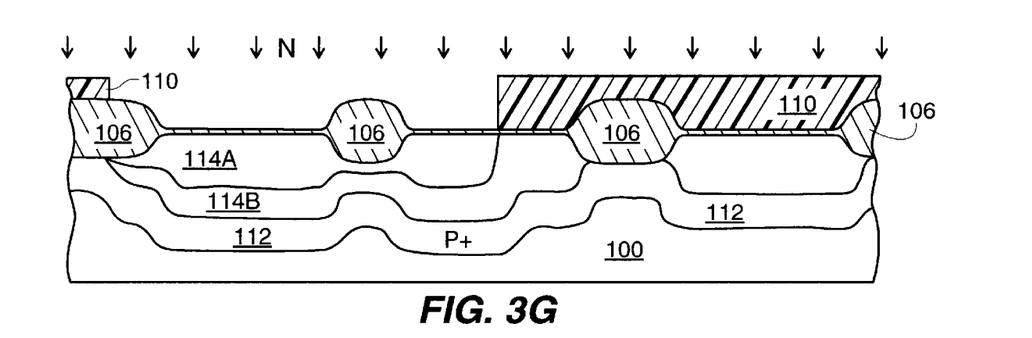
Figure 3H:
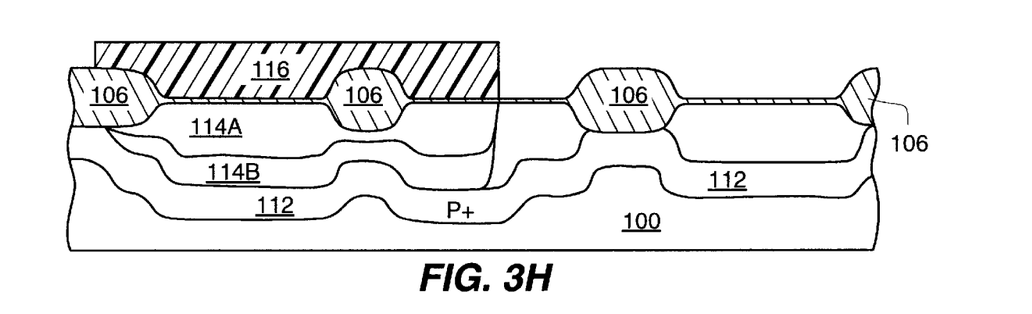

In FIG. 3G, the N-well regions are implanted with a N-type dopant in the form of multiple phosphorous implants to create the desired doping profile according to the present invention. N-well 114a is a shallow N-well implanted using phosphorous in a dose of about $1e12/cm^2$ to about $4e12/cm^2$ at an energy of about 80 Kev to about 150 KeV. Although in the depicted example, specific layer thicknesses, doses, and energy levels have been provided, other thicknesses, doses, and energy levels may be used depending on the desired profiles. The N-well region is implanted using one shallow implant and one retrograde implant in accordance with a preferred embodiment of the present invention. N-well 114b, also called a retrograde N-well, is implanted using phosphorous in a dose of about $3e12/cm^2$ to about $3e13/cm^2$ at an energy of about 400 KeV to about 800 KeV. A retrograde region, such as a retrograde N-well, is a region in which the dopant concentration is higher in deeper portions of the region than at the surface. Thereafter, in FIG. 3H, a P-well mask 116 is applied in patterned for forming P-wells within substrate 100. According to the present invention, the retrograde implant is implanted first (for defect reduction).

Figure 3I:
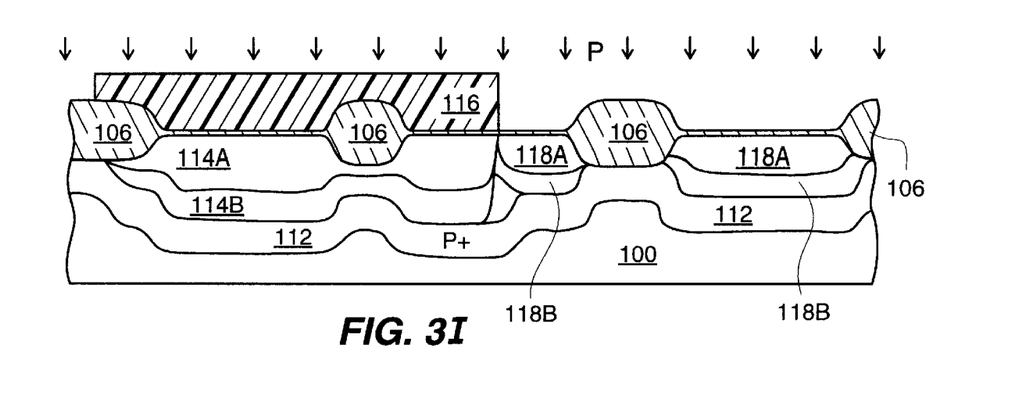

Next, in FIG. 3I, P-well regions are implanted using a P-type dopant, such as boron. Multiple boron implants are employed to establish the required doping profile. P-well regions are implanted using one shallow implant and one deep implant according to the present invention. The shallow implant forming P-well region 118a include implanting boron in a dose of about $8e11/cm^2$ to about $4.5e12/cm^2$ at an energy level of about 50 KeV to about 100 KeV. The deep implant is accomplished by implanting boron in a dose from about $3e12/cm^2$ to about $3e13/cm^2$ at an energy level of about 400 KeV to about 800 KeV to form a retrograde P-well region 118b. Again, according to a preferred embodiment of the present invention, the sequence of the implants in the process is always to implant the deepest layer first and then subsequent shallow implants to avoid implanting through already implant damaged regions of the substrate.

Figure 3J:
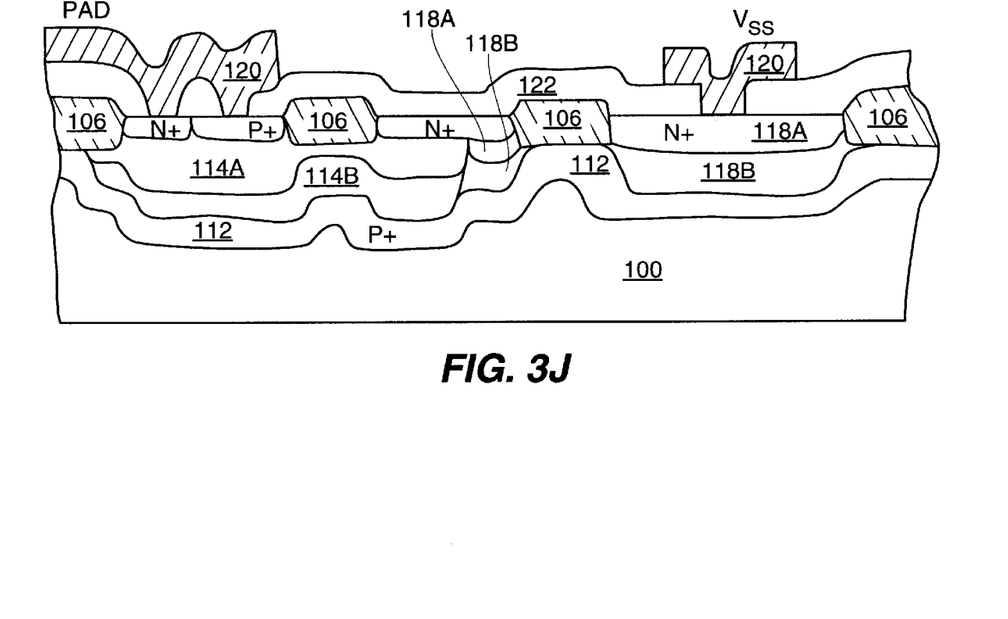
Figure 4A:
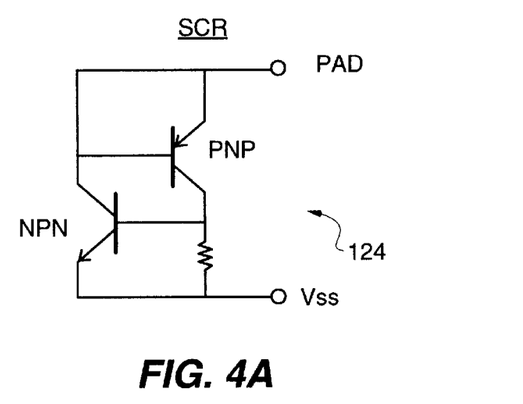
FIGS. 4A and 4B are schematic diagrams of circuits created through the processes depicted in FIGS. 3A–3J.
Figure 4B:
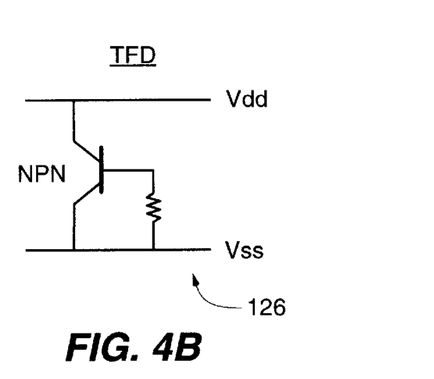
Figure 5:
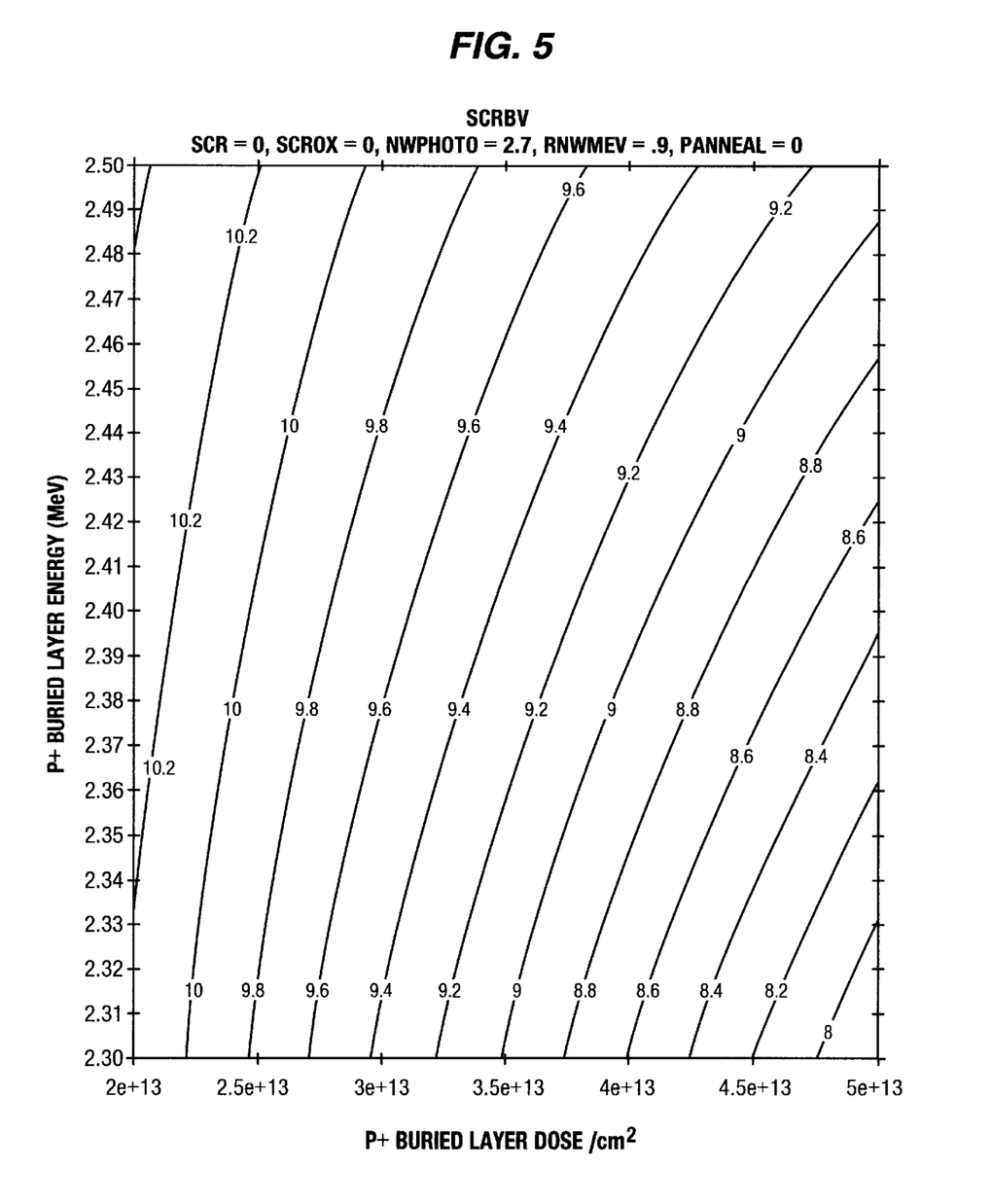
FIGS. 5–8 illustrate graphs of SCR BV (trigger voltage), versus P+ buried dose layer and energy without SCR implant according to the present invention.
Figure 6:
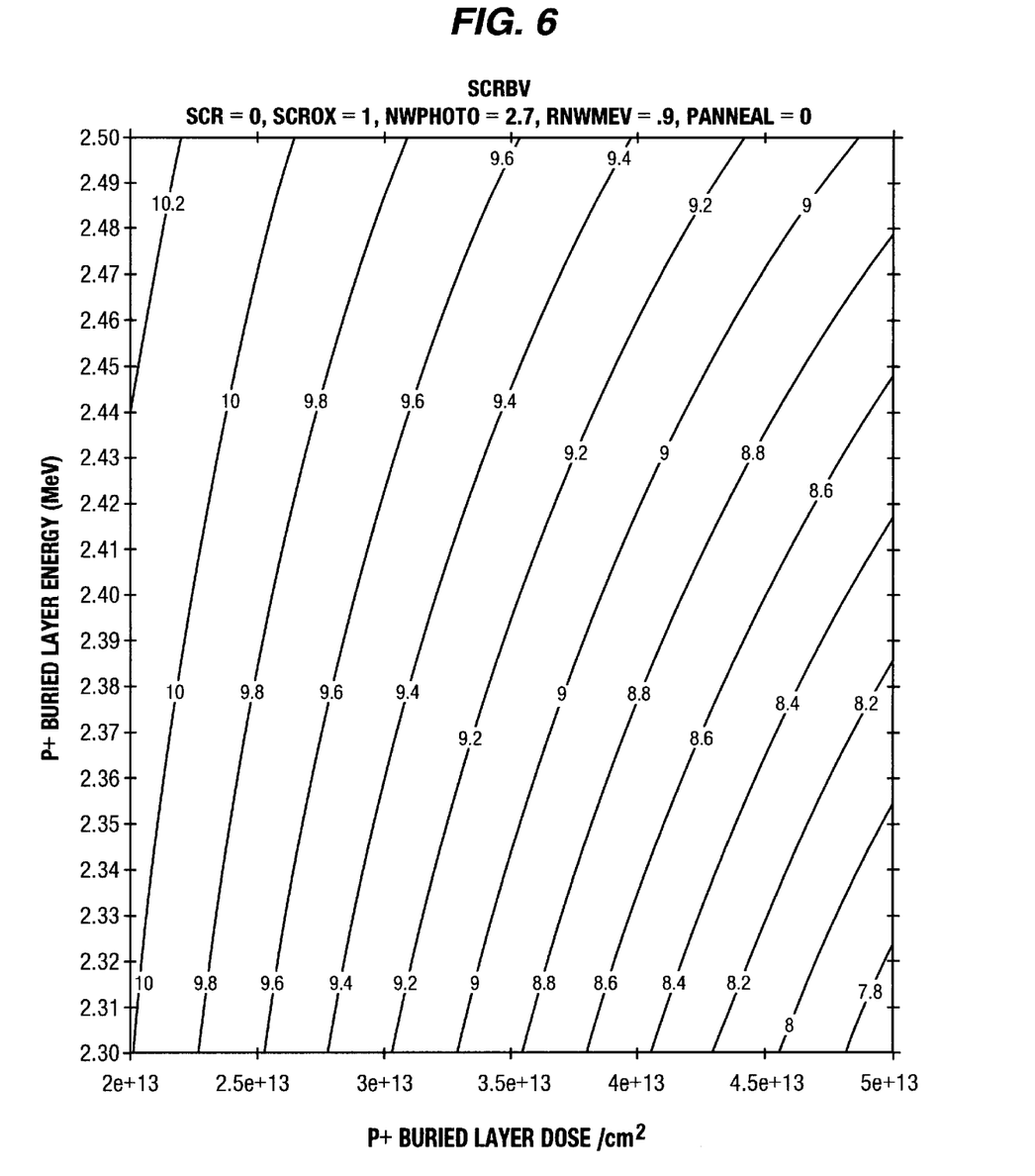
Figure 7:
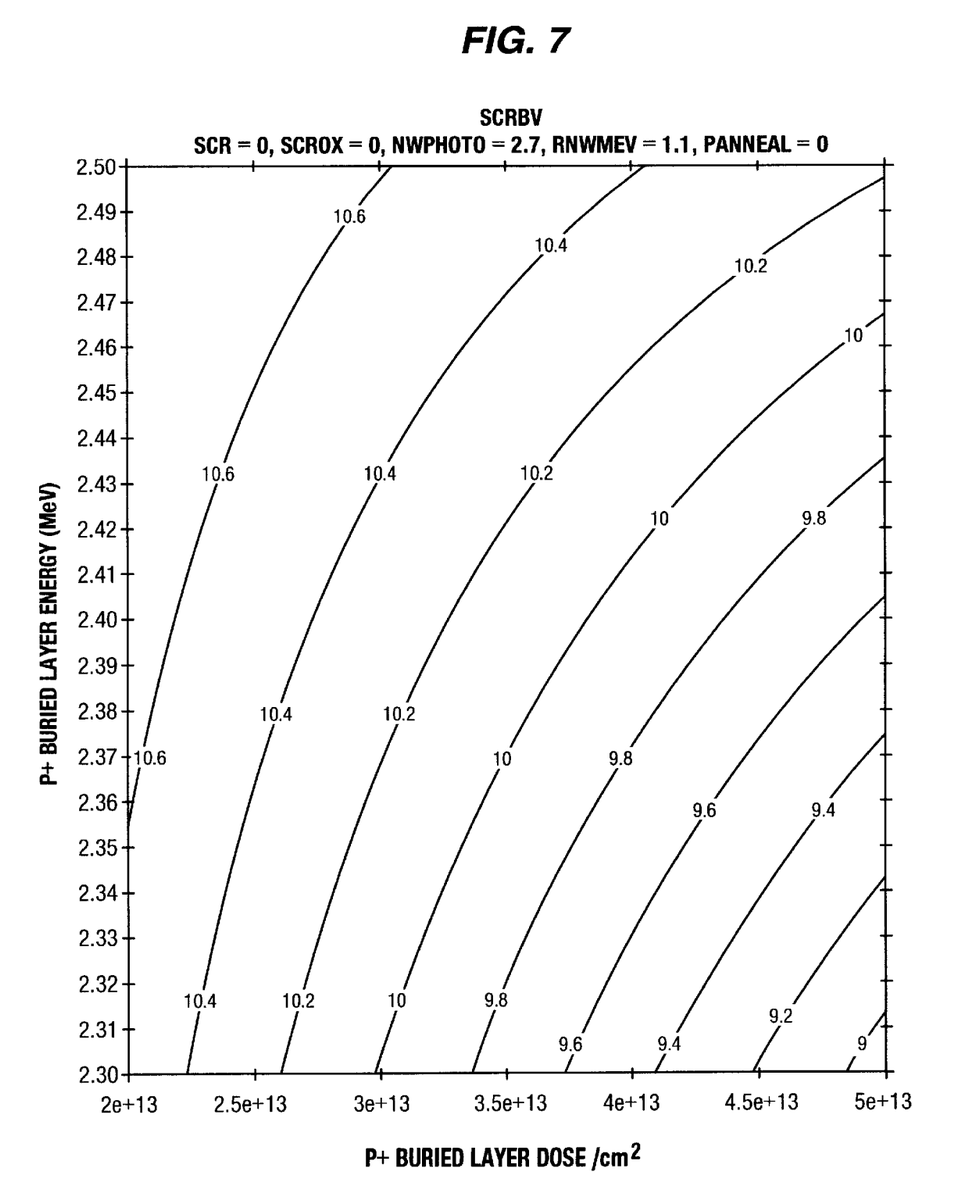
Figure 8:
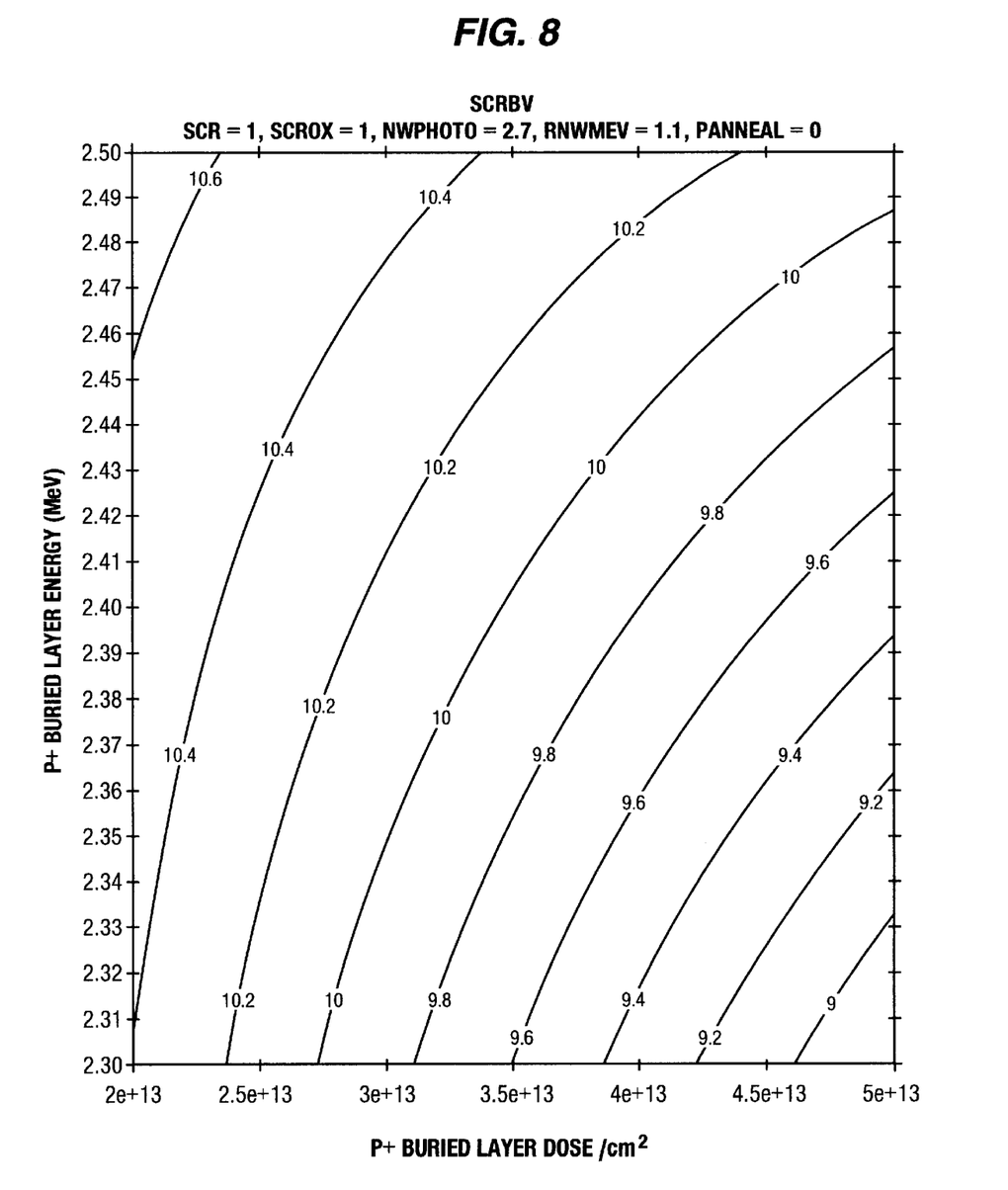

After the wells have been implanted, the screen oxide is stripped off, and a sacrificial gate oxide is grown, the NMOS and PMOS thresholds are adjusted by implanting boron, phosphorous or $BF_2$ in a dose from about $5e11/cm^2$ to about $3e12/cm^2$ at an energy level of about 5 KeV to about 100 KeV, the sacrificial oxide is etched off and the gate oxide is grown. Polysilicon gates are then defined; N+ and P+ source/drain regions are implanted and activated for metal oxide semiconductor (MOS) devices (not shown). Then, the MOS devices are connected with aluminum interconnect 120 and silicon insulating layers 122 to form the SCR including the TFD as shown in FIG. 3J. FIGS. 4A and 4B are schematic diagrams of a SCR 124 and a TFD 126 created by the processes illustrated in FIGS. 3A–3J.

The well implants depicted above were partially or totally masked by the resist layers and the field oxide regions. Total masking implies that the implant is totally blocked by the mask while partial masking implies that some of the implant dose penetrates the mask. Implants can be positioned within the silicon with various well characterized profiles by altering the species, energy, and dose of the implant known to those of ordinary skill in the art. The required doping profiles can be achieved by summing multiple implants. Additionally, increased dopant implant energies lead to a deeper implant profile in the silicon substrate. Increased dopant doses increases the dopant concentration in the silicon. Thus, the desired profiles may be obtained by the use of the masking materials, masking thickness values, and implant and dose energy.

Dopant implant energies in the MeV range allow deep implants that make well definition possible by implantation alone. Activation of the implants species is achieved by elevating the temperature of the wafer to about 800° C. or above, depending on dopant species. Activation can be achieved without moving the dopant species if a low enough time and temperature are chosen as well-known in the art.

The N-well resist thickness and the P+ buried layer implant dose and energy should be optimized for devices other than the SCR for proper operation of the semiconductor device such that:

(1) The P+ buried layer has a concentration under the P-well field oxide to prevent field inversion at maximum Vdd.

(2) The P+ buried layer in the P-well active regions should be deep enough to avoid altering the properties of the NMOS device.

(3) The P+ buried layer in the N-well active regions should be deep enough to avoid altering the properties of the PMOS device, it should also be deeper than the N-well. By default, because it is not masked by the N-well resist, it will be deeper than case (2).

(4) The P+ layer should wrap around, or follow the profiles of the P-well and N-well to prevent parasitic bipolar transistor action.

(5) The P+ layer around the lateral N+ source/drain, and P-under the field oxide and N-well should be of a high enough concentration to spoil the bipolar transistor gain of this lateral NPN so that latch-up is prevented. (defined as the trigger current of the latching SCR at minimum N+ to P-well, N-well to P+ design rules, and the current is greater than 100 mA or the holding voltage is greater than maximum VDD).

The N-well and P-well implants should ensure a deep enough well and provide required concentration in the respective wells to obtain good MOS junction leakage and capacitance properties.

After implant, the thermal cycles are selected as such to activate the implant, but not move the implanted dopants by diffusion. The gate oxide and source/drain diffusion processes are sufficient to achieve this. Once the well structure is complete, the MOS transistors and metal interconnect layers are defined by well known processing techniques.

Figure 9:
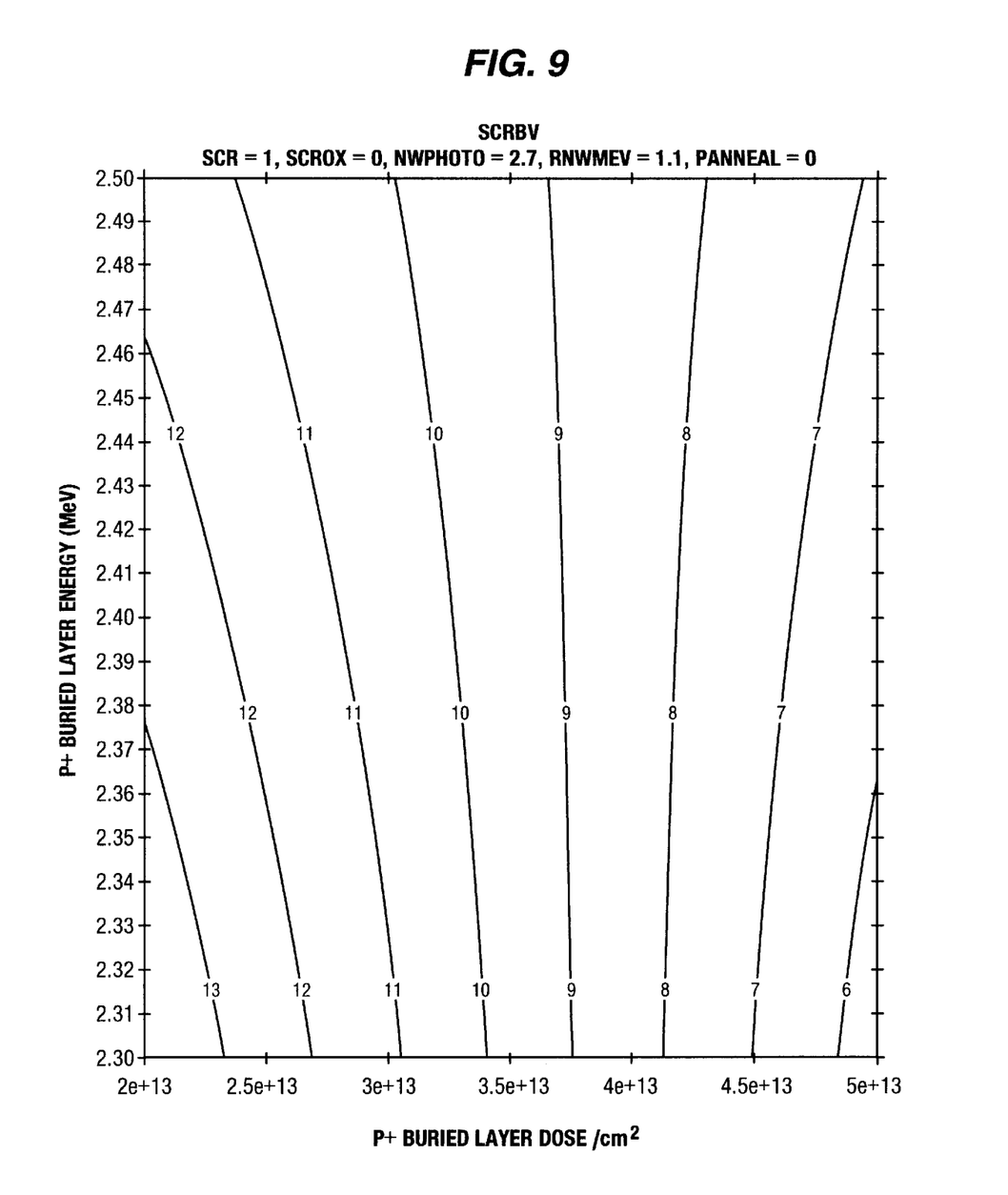
FIGS. 9–10 depict graphs illustrating SCR BV (trigger voltage) versus P+ buried layer dose and energy SCR implants according to the present invention.
Figure 10:
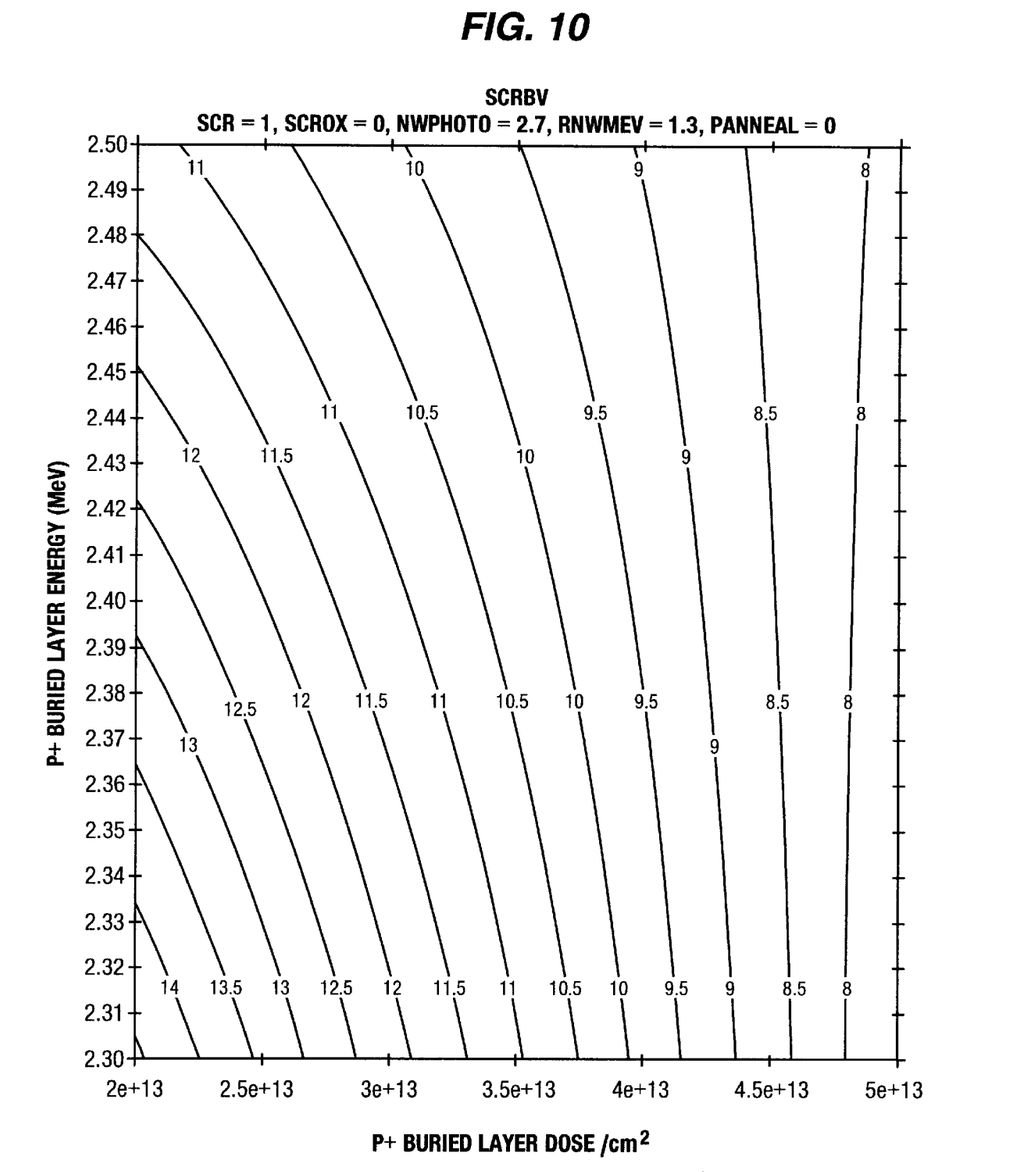

With reference now to FIGS. 5–8, contour plots of SCR breakdown voltage (BV) (trigger voltage) versus P+ buried dose layer and energy without SCR implant are depicted according to the present invention. FIGS. 9 and 10 are contour plots illustrating SCR BV (trigger voltage) versus P+ buried layer dose and energy SCR implants according to the present invention. The lines on the contour plots represent the response surface model.

The P+ buried layer dose was varied from $2e13/cm^2$ to $5e13/cm^2$, and the P+ buried layer energy was varied from 2.3 MeV to 2.4 MeV. The retrograde N-well energy was varied from 1.1 MeV to 1.3 MeV. The SCR implant, when used, was $1.5e14/cm^2$ at 40 KeV. The wells were implanted with and without a screen oxide. The SCR breakdown voltage, without the SCR mask and implant, varied from 11.0 V to 6.0 V under these conditions. Table 1 below shows implant conditions for the graphs in FIGS. 5–8:

TABLE 1

| Implant | Dose/cm² | Energy | Species |
|---|---|---|---|
| P+ Buried Layer | 2e13 to 5e13 | 2.3 to 2.4 Mev | Boron |
| Retrograde N-well | 2.5e13 | 1.1 to 1.3 Mev | Phosphorous |
| Retrograde P-well | 2.5e13 | 500 KeV | Boron |
| SCR | 1.7e13 | 40 KeV | Boron |

TABLE 2

| Terms | |
|---|---|
| SCR = 1 | with SCR implant |
| SCROX = 1 | Implants thru a screen oxide |
| SCR = 0 | without SCR implant |
| SCROX = 0 | implants into bare silicon |
| PANNEAL = 1 | Annealed after implant prior to gate ox |
| PANNEAL = 0 | No anneal after implant prior to gate ox |
| RNMEV | Retrograde N-well energy (MeV) |
| NWPHOTO | N-well phono resist thickness (microns) |
| PBL Dose | P+ buried layer dose (ions/cm**²) |
| PBL MeV | P+ buried layer energy (MeV) |

Thus, the present invention provides an improved method for fabricating both SCR and TFD devices. Through the present invention, the SCR and TFD devices are fabricated without using traditional diffused wells. Instead, implanted wells using energy levels on the order of MeV are employed according to the present invention. Thus, an SCR can be built with or without an SCR mask and implant. Elimination of the SCR implant makes the fabrication of SCR devices quicker and cheaper to manufacture. Additionally, the breakdown voltage in the TFD is adjusted by selectively controlling the boron implant dose of the N+ to P– junction.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a silicon controlled rectifier semiconductor device in a substrate comprising:

defining active regions within the substrate;

forming field oxide regions over regions other than the defined active regions, wherein surfaces of the active regions are located between the field oxide regions;

growing a sacrificial oxide layer on the surfaces of the active regions;

forming a first mask to define regions for implanting well regions using a first type of dopant;

implanting a buried layer using a second type of dopant using the first mask;

implanting well regions using the first type of dopant and using the first mask;

forming a second mask to define regions for implanting well regions using the second type of dopant;

implanting well regions using the second type of dopant and using the second mask; and forming source and drain regions for a and field device and a transistor for the silicon controlled rectifier.

2. The method of claim 1, wherein the step of defining active regions within the substrate comprises:

forming a thin oxide layer on the substrate;

forming a silicon nitride layer on the oxide layer; and etching away portions of the silicon nitride layer, wherein portions of the thin oxide layer are exposed and wherein remaining portions of the silicon nitride layer on the oxide layer define active regions within the substrate.

3. The method of claim 1, wherein the sacrificial oxide layer has a thickness from about 50 angstroms to about 500 angstroms.

4. The method of claim 1, wherein the first type of dopant is a P-type dopant.

5. The method of claim 4, wherein the P-type dopant is boron.

6. The method of claim 1, wherein the second type of dopant is a N-type dopant.

7. The method of claim 6, wherein the N-type dopant is phosphorous.

8. The method of claim 1, wherein the step of implanting well regions using the first type of dopant and the first mask comprises implanting N-well regions with a N-type dopant using multiple implants.

9. The method of claim 8, wherein the step implanting N-well regions comprises implanting a shallow N-well region and a retrograde N-well region.

10. The method of claim 9, wherein the shallow N-well region is implanted using phosphorous in a dose of about 1e12/ $cm^2$ to about 4e12/ $cm^2$ at an energy from about 80 KeV to about 150 KeV.

11. The method of claim 10, wherein the retrograde N-well region is implanted using phosphorous in a dose of about 3e12/ $cm^2$ to about 3e13/ $cm^2$ at an energy of about 400 KeV to about 800 KeV.

12. The method of claim 10, wherein the phosphorous is implanted at an energy of about 80 KeV to about 150 KeV.

13. The method of claim 1, wherein the step of implanting well regions using the second type of dopant and the second mask comprises implanting P-well regions using multiple implants.

14. The method of claim 13, wherein the dopant is a P-type dopant.

15. The method of claim 14, wherein the P-type dopant is boron.

16. A method for fabricating a silicon controlled rectifier semiconductor device in a substrate comprising:

forming an oxide layer on the substrate;

forming a silicon nitride layer on the oxide layer;

etching away portions of the silicon nitride layer, wherein portions of the oxide layer are exposed and wherein remaining portions of the silicon nitride layer on the oxide layer define active regions in the substrate;

forming field oxide regions in the exposed portions of the oxide layer;

removing the remaining portions of the silicon nitride layer and the oxide layer, wherein the active regions in the substrate are exposed;

growing a sacrificial oxide layer in the exposed active regions;

forming a first mask to define regions for N-well implantations;

implanting a P+ buried layer;

implanting N-well regions with N-type dopants using multiple implants to define a desired profile for the N-type dopants in the N-well regions;

removing the first mask; forming a second mask to define regions for P-well implantations; and implanting P-well regions with P-type dopants using multiple implants to define a desired profile for the P-type dopants in the P-well regions;

forming source drain regions for a field device and a transistor; and forming interconnections to connect the field device and the transistor to form the silicon controlled rectifier semiconductor device.

17. The method of claim 16, wherein the steps of implanting a P+ buried layer comprises implanting the P+ buried layer using an energy level from about 1.3 MeV to about 2.5 MeV.

18. The method of claim 16, wherein the steps of forming a first mask and forming a second mask include forming the first mask and the second mask using photoresist masks.

19. The method of claim 16, wherein the step of implanting P-well regions comprises implanting a shallow P-well region and a retrograde P-well region.

20. The method of claim 16, wherein the step of implanting N-well regions comprises implanting a shallow N-well region and a retrograde N-well region.

21. The method of claim 20, wherein the P-type dopant is boron.

22. The method of claim 1, wherein the field device is a lateral NPN transistor and wherein the transistor is a vertical PNP transistor in which an emitter of the lateral NPN transistor is common with a base of the vertical PNP transistor.

23. The method of claim 16, wherein the field device is a lateral NPN transistor and the transistor is a vertical PNP transistor.

24. The method of claim 16, wherein the N-type dopants and the P-type dopants are thermally activated without substantially moving the N-type dopants and P-type dopants.

25. The method for fabricating a silicon controlled rectifier in a substrate comprising:

defining active regions within the substrate;

forming field oxide regions over regions other than the defined active regions, wherein surfaces of the active regions are located between the field oxide regions;

implanting a buried layer using a first type of dopant and a first mask;

implanting a first number of well regions using multiple implants of a second type of dopant and using the first mask, wherein the multiple implants are used to create a desired profile for the first number of well regions;

implanting a second number of well regions using multiple implants of the first type of dopant and using a second mask in place of the first mask, wherein the multiple implants are used to create a desired profile for the second number of well regions;

forming source and drain regions for a field device and a transistor; and forming interconnections between the field device and the transistor to form the silicon controlled rectifier.

26. The method of claim 25, wherein the field device is a lateral NPN transistor and the transistor is a vertical PNP transistor.

27. The method of claim 25, wherein the steps of implanting a first number of well regions and a second number of well regions include using dopant implant energies in a MeV range.

28. The method of claim 25 further comprising:

activating dopants in the well regions using thermal activation without substantially altering the desired profile for the first number of well regions and the desired profile for the second number of well regions.

* * * * *